United States Patent
Tanaka et al.

(10) Patent No.: US 7,001,851 B2
(45) Date of Patent: Feb. 21, 2006

(54) STEAM OXIDATION METHOD

(75) Inventors: Yoshiyuki Tanaka, Kanagawa (JP);
Hironobu Narui, Kanagawa (JP);
Yoshinori Yamauchi, Kanagawa (JP);
Yuichi Kuromizu, Kanagawa (JP);
Yoshiaki Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/871,900

(22) Filed: Jun. 18, 2004

(65) Prior Publication Data
US 2005/0014387 A1    Jan. 20, 2005

(30) Foreign Application Priority Data
Jun. 27, 2003    (JP)    ............... 2003-184456

(51) Int. Cl.
*H01I 21/31*    (2006.01)
*H01L 21/469*    (2006.01)

(52) U.S. Cl. .................. 438/773; 438/770

(58) Field of Classification Search ........... 438/773, 438/770, 771, 708, 710, 711, 712, 713, 714, 438/715, 903
See application file for complete search history.

(56) References Cited

U.S. PATENT DOCUMENTS

| | | | | |
|---|---|---|---|---|
| 4,977,839 A | * | 12/1990 | Fochtman et al. | 110/346 |
| 6,255,731 B1 | * | 7/2001 | Ohmi et al. | 257/758 |
| 6,503,819 B1 | * | 1/2003 | Tanabe et al. | 438/591 |
| 6,784,116 B1 | * | 8/2004 | Tanabe et al. | 438/773 |

* cited by examiner

Primary Examiner—David Nhu
(74) Attorney, Agent, or Firm—Robert J. Depke; Trexler, Bushnell, Giangiori, Blackstone & Marr, Ltd.

(57) ABSTRACT

This invention provides a steam oxidation method of a matter to be oxidized with proper controllability and reproducibility. It is provided a steam oxidation method, where a semiconductor substrate (a matter to be oxidized) is housed in a steam oxidation reactor and is subjected to: a first step of supplying $N_2$ gas to the reactor housing the semiconductor substrate and substituting the inside of the reactor with $N_2$ gas; a second step of stopping supply of the $N_2$ gas and supplying a steam-accompanied $N_2$ gas, in which the $N_2$ gas is accompanied with steam, to the reactor; a third step of increasing a temperature of the semiconductor substrate to 450° C. (a steam oxidation temperature) while supplying the steam-accompanied $N_2$ gas; and a fourth step of holding the semiconductor substrate for a predetermined time at 450° C.

6 Claims, 7 Drawing Sheets

PRIOR ART

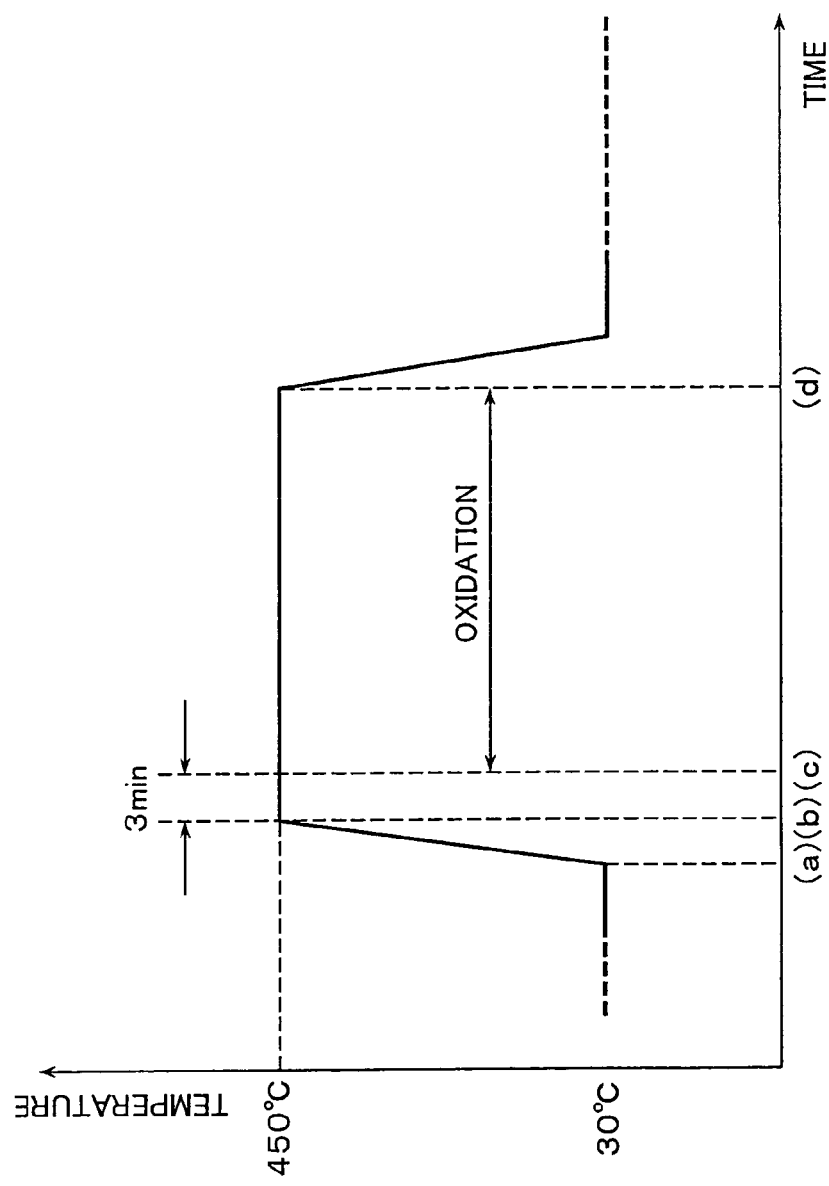

US 7,001,851 B2

STEAM OXIDATION METHOD

The present application claims priority to Japanese Patent Application JP2003-184456, filed in the Japanese Patent Office Jun. 27, 2003; the entire contents of which is incorporated herein by reference.

BACKGROUND OF THE INVENTION

1. Field of the Invention

This invention relates to a steam oxidation method of subjecting a matter to be oxidized housed in a reactor to steam oxidation and more particularly to a steam oxidation method of subjecting a matter to be oxidized to steam oxidation with proper controllability and reproducibilty when carrying out steam oxidation.

2. Description of Related Art

The steam oxidation method is frequently used, for example, for forming an oxidation confining type, current-confining layer of a surface emitting laser element.

The surface emitting laser element is a semiconductor laser element emitting laser light in vertical direction relative to a substrate surface. As a surface emitting laser element of an 850 nm wavelength band, attention is being drawn to a surface emitting laser element formed on a semiconductor substrate such as GaAs, comprising a pair of DBRs (Diffractive Bragg Reflector) consisting of a pair of AlGaAs/AlGaAs or the like of mutually different Al composition, and an active layer of an AlGaAs type that will serve as a light-emitting region provided between that pair of DBRs.

In such a surface emitting laser element, to enhance a light-emitting efficiency and lower a threshold current, it is necessary to limit a cross-sectional area of a current path of a current to be injected into the active layer. Conventionally, there is employed a method such as providing higher resistance of an ion injected region through an $H^+$ ion injection. However, in recent years, as a method of limiting this current path, there is a mainstream method of forming a current-confining structure by letting a high Al containing layer such as an AlAs layer interposed in a multi-layer film and oxidizing selectively a predetermined area of the high Al containing layer for conversion thereof to $Al_2O_3$ of high electric resistance.

Referring to FIG. 2, description will be made of an example of a construction of a surface emitting laser element having a current-confining structure formed by oxidation of the AlAs layer. FIG. 2 is a sectional view showing the construction of the surface emitting laser element.

A surface emitting laser element 10 is, as shown in FIG. 2, a multi-layered structure comprising a lower DBR 14 composed of an n-type semiconductor multi-layer film, an $Al_{0.3}Ga_{0.7}As$ lower clad layer 16, an active layer 18, an $Al_{0.3}Ga_{0.7}As$ upper clad layer 20, an upper DBR 22 composed of a p-type semiconductor multi-layer film, and a p-type GaAs contact layer 24, all of which are sequentially formed on an n-type GaAs substrate 12.

The lower DBR 14 is constructed as a semiconductor multi-layer film with an n-type $Al_{0.2}Ga_{0.8}As$ layer and an n-type $Al_{0.9}Ga_{0.1}As$ layer.

The upper DBR 22 as a semiconductor multi-layer film with a p-type $Al_{0.2}Ga_{0.8}As$ layer and a p-type $Al_{0.9}Ga_{0.1}As$ layer.

Also, the p-type $Al_{0.9}Ga_{0.1}As$ layer of a first pair in the upper DBR 22 adjacent to the upper clad layer 20 is, in lieu of the p-type $Al_{0.9}Ga_{0.1}As$ layer, replaced with a p-type Al As layer 26a, and the AlAs layer, excluding a circular area in the center, is selectively oxidized and converted to an Al oxidized layer 26b.

Namely, this layer constitutes a current-confining layer 26 where the Al oxidized layer 26b functions as an oxidation confining type, current-confining region of high electric resistance and where the AlAs layer 26a functions as a current injection region.

The contact layer 24 and the upper DBR 22 are subjected to etching and processed to a columnar mesa post 20 of a circular cross section.

The contact layer 24 on an upper surface of the mesa post 30 opens a light-emitting window 32 in a vicinity of the center and is formed in a circular ring shape.

In manufacturing the surface emitting laser element 10, as shown in FIG. 3, a multi-layered structure is formed by depositing first on the n-type GaAs substrate 12, in the order of the lower DBR 14, the lower clad layer 16, the active layer 18, the upper clad layer 20, the upper DBR 22 having the AlAs layer 26a, and the contact layer 24.

Next, the vicinity of the center of the contact layer 24 is removed and the light-emitting window 32 is opened.

Subsequently, the reactive ion beam etching method (RIBE) is used to etch the contact layer 24 and the upper DBR 22 up to the upper clad layer 20, thus forming the columnar mesa post 30.

Consequently, there is obtained a semiconductor substrate 44 consisting of a multi-layered structure having the mesa post 30 as shown in FIG. 3.

Next, the semiconductor substrate 44 is heated in a steam atmosphere to oxidize the AlAs layer 26a until a desired oxidation confining diameter is obtained.

In the AlAs layer 26a on the upper DBR 22, AlAs on the periphery of the mesa post 30 is selectively oxidized, generating the Al oxidized layer 26b, while, at the same time, a central region of the mesa post structure 30 remains as the original AlAs layer 26a.

In forming a current-confining structure of the oxidation confining type into a semiconductor substrate by subjecting a high Al containing layer such as the AlAs layer 26a to steam oxidation, a steam oxidation apparatus described below will be used. Referring to FIG. 4, an example of a construction of a steam oxidation apparatus for subjecting the high Al containing layer to steam oxidation will be explained. FIG. 4 is a schematic diagram showing the construction of the steam oxidation apparatus 40. The steam oxidation apparatus 40 is an invention disclosed in patent application Ser. No. 2003-14260.

The steam oxidation apparatus 40 is an apparatus to be used when forming a current-confining structure into a surface emitting laser element by subjecting the high Al containing layer to steam oxidation. As shown in FIG. 4, as a reactor carrying out steam oxidation, it is equipped with a horizontal-type reactor 42 of a single-slice treatment type.

The reactor 42 comprises a quartz chamber 48 in a horizontal square tube type, an electric heater 50 set up around the quartz chamber 48, and a susceptor 46 housed in the quartz chamber 48, which supports a semiconductor substrate 44 having a multi-layered structure in which the above-mentioned mesa post 30 is formed.

The electric heater 50 is a lamp heater, being capable of increasing a substrate temperature of the semiconductor substrate 44 by irradiation of the lamp.

Further, the steam oxidation apparatus 40 comprises a steam-accompanied inert gas system supplying a steam-accompanied inert gas to the reactor 42, an inert gas system supplying an inert gas to the reactor 42, a reactor bypass pipe 52 subjecting the steam-accompanied inert gas system and the inert gas system to reactor bypassing, and an exhaust system venting a gas discharged from the reactor 42.

The exhaust system has a water-cooled trap 54, comprising a gas discharge port 42B of the reactor 42 and a 4 th gas pipe 56 which leads a gas transmitted from the reactor bypass pipe 52 to the water-cooled trap 54, and a 5th gas pipe 58 which exhausts a gas that passed through the water-cooled trap 54.

The steam-accompanied inert gas system consists of an $H_2O$ bubbler which houses pure water, into which an inert gas is transmitted to cause bubbling, and which generates a steam-accompanied inert gas; a 1st gas pipe 64 which is connected to an inert gas source transmits an inert gas whose flow is controlled by an MFC (Mass Flow Controller) 62A into the $H_2O$ bubbler; and a 2nd gas pipe 68 which transmits a steam-accompanied inert gas generated in the $H_2O$ bubbler through an automatic valve 66A into a gas flow-in port 42A of the reactor 42.

The inert gas system includes a 3rd gas pipe 70 which is connected to an inert gas source and transmits an inert gas, whose flow is controlled by the MFC 62B, through an automatic valve 66C to a gas flow-in port of the reactor 42.

The reactor bypass pipe 52 has its one end connected to the 2nd gas pipe 68 through an automatic valve 66B, and it is connected to the 3rd gas pipe 70 through an automatic valve 66D, its other end being connected to the 4 th gas pipe 56, whereby the steam-accompanied inert gas and the inert gas are subjected to reactor bypassing.

When supplying the steam-accompanied inert gas supplied from the steam-accompanied inert gas system to the reactor 42, the automatic valve 66A is opened, and an automatic valve 66B is closed. When supplying the inert gas from the inert gas system to the reactor 42, the automatic valve 66C is opened, and the automatic valve 66D is closed.

Also, by closing the automatic valve 66A and opening the automatic valve 66B, it is possible to convey the steam-accompanied inert gas supplied from the steam-accompanied inert gas system to the reactor bypass pipe 52. By closing the automatic valve 66C and opening the automatic valve 66D, it is possible to convey the inert gas supplied from the inert gas system to the reactor bypass pipe 52.

The $H_2O$ bubbler 60 is housed in a constant-temperature bath 72, and water in the $H_2O$ bubbler 60 is held at a predetermined temperature by the constant-temperature bath 72 and by the inert gas flow which is controlled by the MFC 62A.

Related Art Example

Steam oxidation of a high Al containing layer such as the above-mentioned AlAs layer 26a has thus far been carried out as follows by using steam oxidation equipment 40, one example of which is shown in FIG. 4. Referring to FIG. 5, a steam oxidation method for oxidizing the AlAs layer 26a of the semiconductor substrate 44 will be described. FIG. 5 is a time table showing a sequence of the conventional steam oxidation method.

First, an operating condition of the constant-temperature bath 72 and a flow rate condition of MFC 62A are set such that the temperature of the $H_2O$ bubbler 60 is held at 80° C. at all times.

Next, the lamp heater 50 is turned on, and at a time point (a), the semiconductor substrate 44 in the normal temperature (approx. 30° C.), that is, the multi-layered structure in which the above-mentioned mesa post 30 was formed is inserted into the reactor 24. Then, at a time point (b) when the temperature of the semiconductor substrate 44 reaches 450° C., supply of $N_2$ gas is started and continued for 3 minutes.

Subsequently, at a time point (c) of 3 minutes after the supply of $N_2$ gas is started, the supply of the steam-accompanied $N_2$ gas in lieu of $N_2$ gas is started. While supplying the steam-accompanied $N_2$ gas, at a time point (d) after a lapse of a preset time, that is, at a time point when a predetermined region of the AlAs layer 26a of the semiconductor substrate 44 is oxidized in steam, the supply of the steam-accompanied $N_2$ gas is stopped. The semiconductor substrate 44 is cooled to the normal temperature and the semiconductor substrate 44 is taken out from the reactor 42.

As mentioned above, it is possible that the AlAs layer 26a of the semiconductor substrate 44 is oxidized in steam, thus forming the current-confining structure of the oxidation confining type.

Since related art technical documents regarding the conventional steam oxidation method described above were not available, disclosure of the related art technical information is omitted.

SUMMARY OF THE INVENTION

However, in the related art steam oxidation method mentioned above, there was a problem of difficulty in forming the AlAs layer with proper controllability and reproducibility when oxidizing in steam a high Al containing layer such as the AlAs layer 26a.

Accordingly, it is an object of the present invention to provide a steam oxidation method for oxidizing in steam a matter to be oxidized with proper controllability and reproducibility when oxidizing in steam a matter to be oxidized housed in the reactor.

The present inventor made a review to solve the above-mentioned problem and found out that in the conventional steam oxidation method, after inserting a semiconductor substrate into the reactor, there was an increase in temperature before supplying a steam-accompanied inert gas (steam-accompanied $N_2$ gas), so that due to residual water inside the reactor, the high Al containing layer was subjected to natural oxidation, thus deteriorating the controllability of forced oxidation through steam oxidation.

Namely, according to the time table shown in FIG. 5, from the time point (a) of inserting the semiconductor substrate 44 into the reactor 42, heating of the semiconductor substrate 44 is started by the lamp heater 50.

Consequently, before the inside of the reactor 42 is completely substituted with the $N_2$ gas at the time point (b) when the $N_2$ gas is supplied, natural oxidation of the AlAs layer 26a of the semiconductor substrate 44 takes place due to a minute amount of water remaining in the reactor 42.

Moreover, as the temperature of the semiconductor substrate 44 is increased to 450° C. which is the steam oxidation temperature or a temperature close to the steam oxidation temperature, before the inside of the reactor 42 is completely substituted with the $N_2$ gas, oxidation reaction is thus promoted even more.

And, it was found out that as a result of this natural oxidation, it is difficult to properly control the forced oxidation by steam, thereby it is difficult to control or reproduce the proper shape of the Al oxidized layer 26b.

The present inventors have conceived an idea that after substituting the inner atmosphere of the reactor having the semiconductor substrate with an inert gas and eliminating residual water in the reactor, supply of the steam-accompanied inert gas is started to increase the temperature of the semiconductor substrate to the steam oxidation temperature, and thereby natural oxidation due to residual water could be controlled.

Based on the information described above, to accomplish the above-mentioned need, it is provided a steam oxidation method according to the present invention, where a matter to be oxidized is housed in a steam oxidation reactor, which comprises: a step of supplying an inert gas to the reactor housing the matter to be oxidized and substituting the inside of the reactor with the inert gas; a step of stopping supply of the inert gas and supplying a steam-accompanied inert gas, in which the inert gas is accompanied with steam, to the reactor; a step of increasing a temperature of the matter to be oxidized to a steam oxidation temperature while supplying the steam-accompanied inert gas; and a subsequent step of holding the matter to be oxidized for a predetermined time at the steam oxidation temperature.

According to the method of the present invention, after substituting the inside of the reactor housing the semiconductor substrate with the inert gas and eliminating any residual water in the reactor, supply of the steam-accompanied inert gas is started and by increasing the temperature of the semiconductor substrate to the steam oxidation temperature, natural oxidation of the matter to be oxidized due to residual water in the reactor may be restrained.

In a manner described above, in the steam oxidation of the matter to be oxidized which is housed in the reactor, it is possible to enhance controllability of forced oxidation by means of steam oxidation and to carry out steam oxidation of the matter to be oxidized through proper controllability and reproducibility.

In the present invention, the matter to be oxidized is preferably a compound semiconductor multi-layered matter having a high Al containing layer for manufacturing a surface emitting laser element, wherein the high Al containing layer is oxidized in steam to form a current-confining structure of an oxidation confining type in the compound semiconductor multi-layered matter for manufacturing the surface emitting laser.

This enables, with proper controllability and reproducibility, the formation of the current-confining structure of the oxidation confining type in the compound semiconductor multi-layered matter for the surface emitting laser.

The present invention has preferably an Al composition of over 80% in the high Al containing layer. This makes it possible to obtain proper effect as mentioned above.

In a preferred embodiment of the present invention, the temperature of the matter to be oxidized at the step of supplying the steam-accompanied inert gas to the reactor is more than 20° C. and less than 250° C.

The above lower limit temperature is the normal temperature, and if the above temperature exceeds 250° C., natural oxidation due to residual water in the reactor will proceed.

In a preferred embodiment of the present invention, the steam oxidation temperature is more than 350° C. and less than 500° C.

If the above temperature is less than 350° C., the oxidation rate of the matter to be oxidized is too slow to obtain a desired oxidized layer, and, if the above temperature is more than 500° C., the oxidation rate of the matter to be oxidized is too fast to obtain sufficient controllability of the shape of the oxidized layer.

The inert gas for the present invention is preferably $N_2$ gas. This makes it possible to obtain proper effect as mentioned above.

BRIEF DESCRIPTION OF THE DRAWINGS

FIG. 5 is a time table showing a steam oxidation method of a conventional example;

DESCRIPTION OF THE PREFERRED EMBODIMENTS

With reference to attached drawings, preferred embodiments of the present invention will be described concretely and in detail, by citing examples of the embodiments. Incidentally, the embodiment described hereinbelow is illustrative. The invention is not limited thereto.

EXAMPLE OF AN EMBODIMENT

Figure 1:
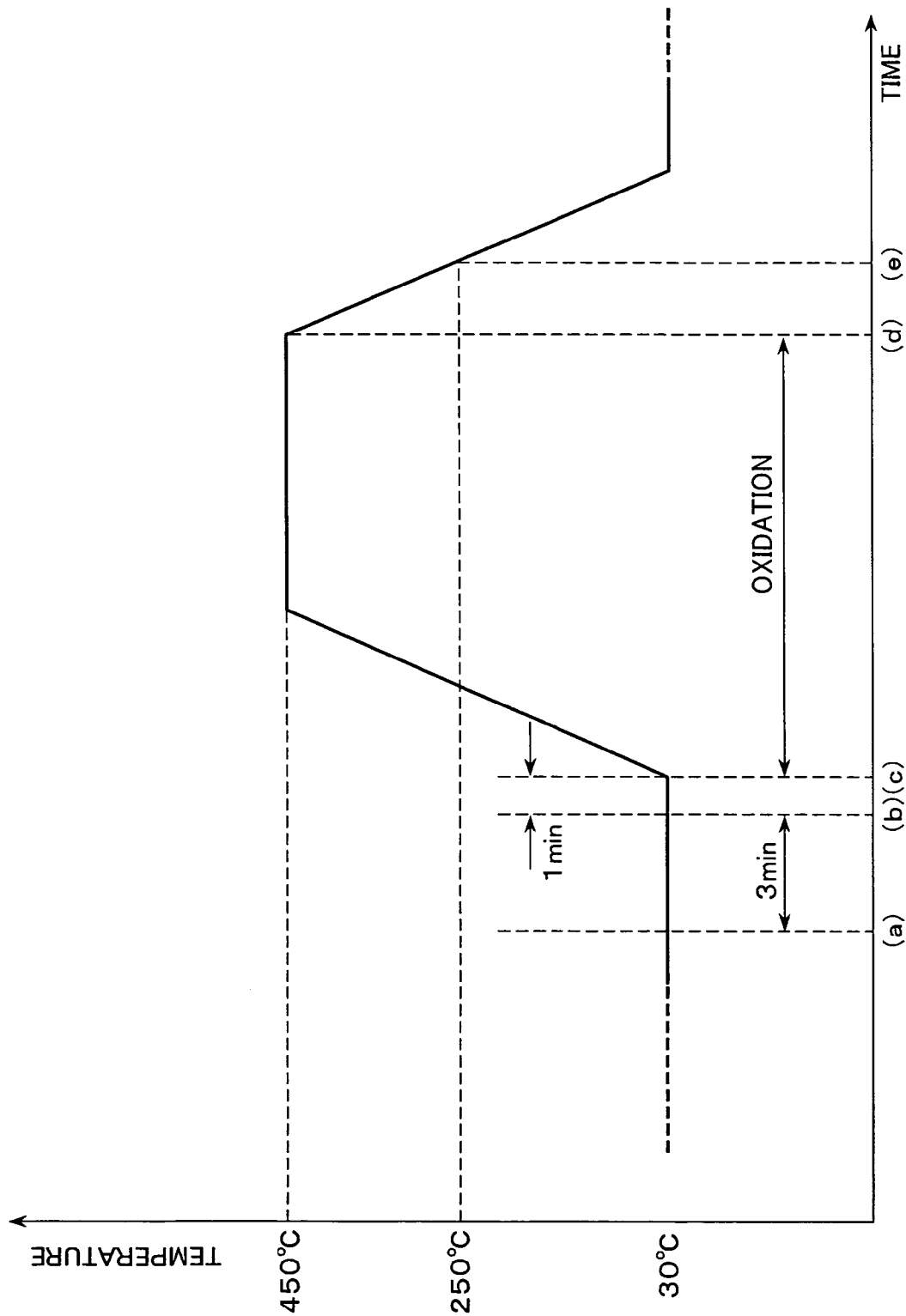
FIG. 1 is a time table showing a steam oxidation method of an embodiment of the present invention.
Figure 3:
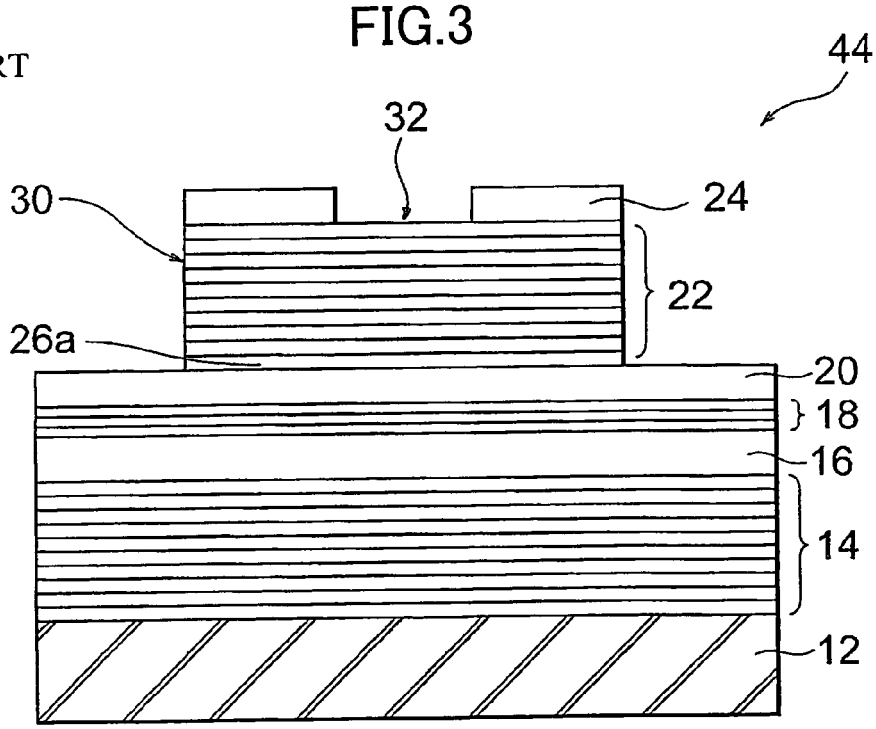
FIG. 3 is a sectional view showing a semiconductor substrate having a multi-layered structure in which a mesa post is formed.
Figure 4:
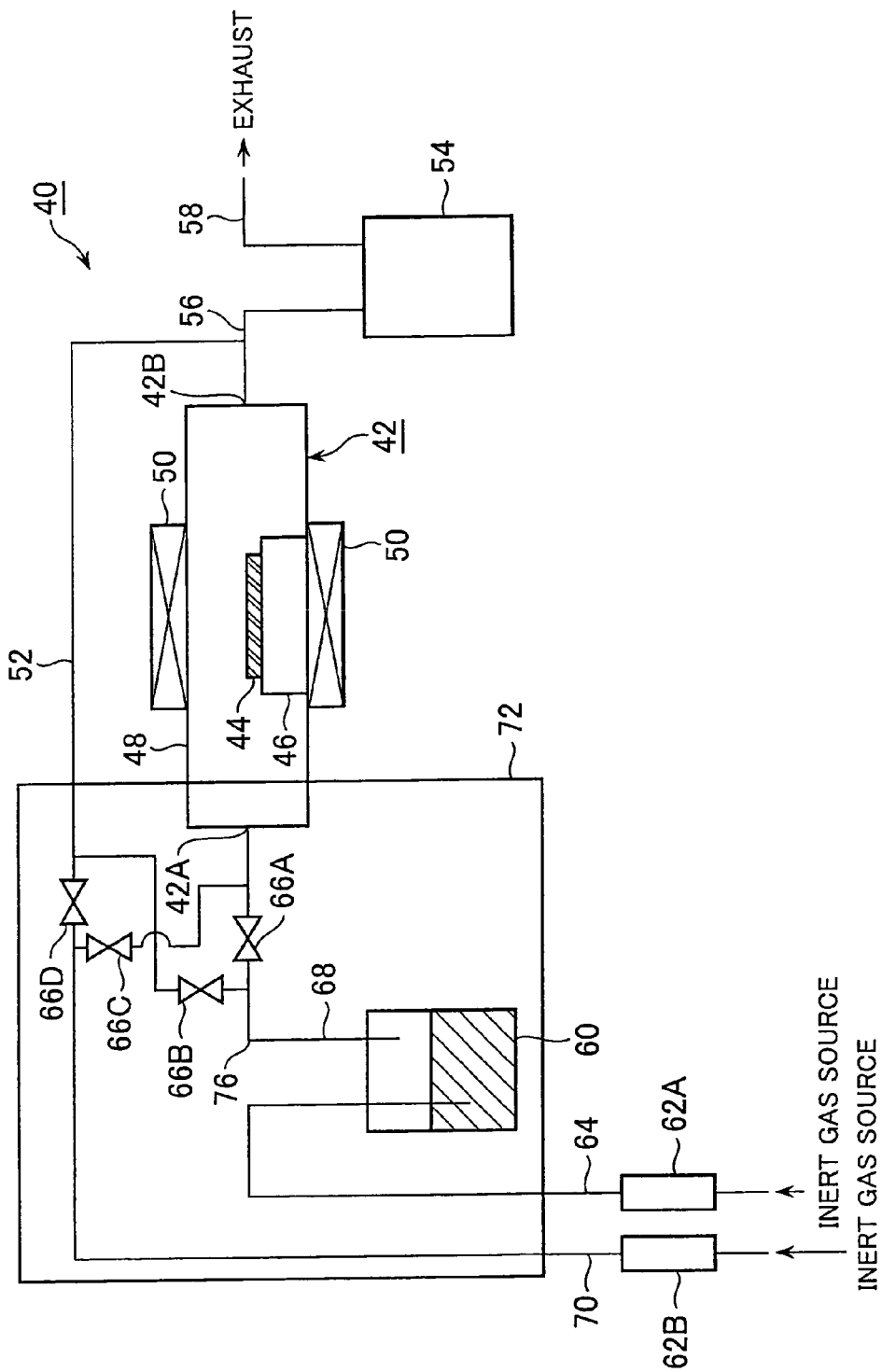
FIG. 4 is a schematic illustration of an example of a configuration of a steam oxidation apparatus.

This is an example of an embodiment of the steam oxidation method according to the present invention, and FIG. 1 is a time table showing a sequence of the steam oxidation method of the present example of an embodiment. In the present example of an embodiment, the matter to be oxidized is a semiconductor substrate 44 constituted by a multi-layered structure in which the mesa post 30 shown in FIG. 3 is formed. Steam oxidation of the AlAs layer 26a of the semiconductor substrate 44 is to be carried out by using the steam oxidation apparatus 40 shown in FIG. 4.

According to a steam oxidation method of the present example of an embodiment, before the lamp heater 50 is turned on, at the time point (a), the semiconductor substrate 44 is inserted into the reactor 42, being held on the susceptor 46, and $N_2$ gas is supplied. $N_2$ gas supply is conducted at least longer than time required for substituting the inside of the reactor 42 with the $N_2$ gas. In the present example of an embodiment, it is conducted for about 3 minutes.

Next, at the time point (b), $N_2$ gas supply is stopped and supplying steam-accompanied $N_2$ gas to the reactor 42 is started and continued for about 1 minute.

Subsequently, while supplying the steam-accompanied $N_2$ gas, at the time point (c), a current is run into the lamp heater 50 and this is continued for about 10 minutes up to the time point (c). As a result of heating by the lamp heater 50, the temperature of the semiconductor substrate 44 reaches 450° C. (steam oxidation temperature) in about 4 minutes and 450° C. is continued to be held up to the time point (d). This enables the AlAs layer 26a of the semiconductor substrate 44 to be steam oxidized from a side face of the mesa post 30 thus enabling the Al oxidized layer 26b to be formed.

When heating the semiconductor substrate 44, if the temperature gradient is too large, a wafer may possibly be damaged. Also, if the temperature gradient is too small in comparison with the overall steam oxidation time (from the time point (c) to the time point (d)), control of the shape of the Al oxidized layer is made difficult. Consequently, it is desirable for the time of temperature increase to be about half of the overall steam oxidation time.

Next, at the time point (d), $N_2$ gas for cooling is supplied in lieu of the steam-accompanied $N_2$ gas. At the time point (e) when the temperature of the semiconductor substrate 44 decreases to 250° C., the semiconductor substrate 44 is taken out, and the semiconductor substrate 44 is cooled down to the normal temperature.

By the above-mentioned procedures, it is possible to form the current-confining layer 26 of the oxidation confining type in the semiconductor substrate 44.

EXAMPLE OF AN EXPERIMENT

Regarding the semiconductor substrate 44 having a film thickness of the AlAs layer 26a as 40 nm, steam oxidation was carried out according to the steam oxidation method of the present example of an embodiment, and this was treated as sample 1 of the embodiment example.

Also, in lieu of formation of the mesa post 30, regarding another semiconductor substrate (not illustrated) which is a multi-layered structure having the same multi-layered structure as the semiconductor substrate 44 subjected to cleavage into a flat plate, its steam oxidation was carried out according to the steam oxidation method of the present example of an embodiment, and this was treated as sample 2 of the embodiment example.

Figure 6A:
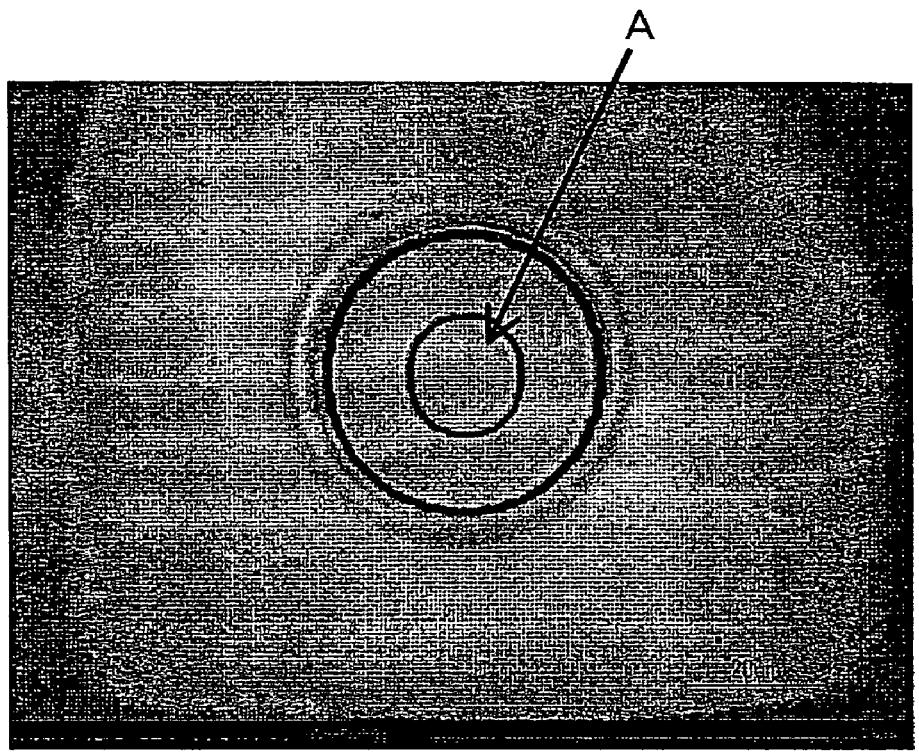
FIG. 6A and FIG. 6B are respectively infrared microscopic photographs of the semiconductor substrate 44 and another semiconductor substrate, the AlAs layers of which were steam oxidized according to the steam oxidation method of the example of an embodiment.
Figure 6B:
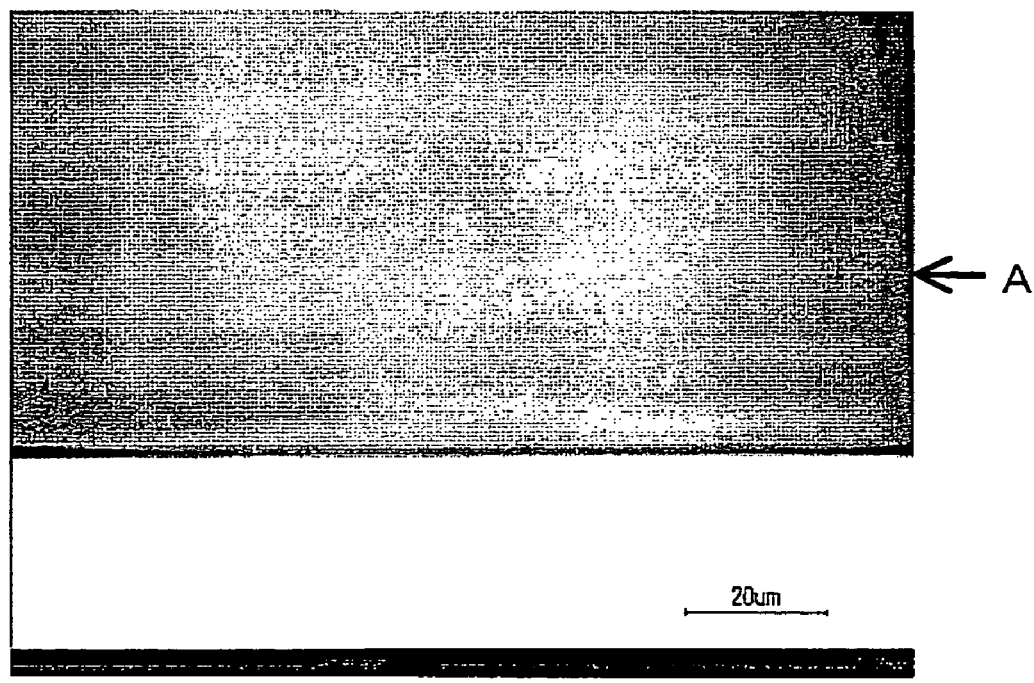

Infrared microscopic photographs taken from above the semiconductor substrate regarding the sample 1 of the embodiment example and the sample 2 of the embodiment example are respectively shown in FIG. 6A and FIG. 6B.

An arrow A in FIGS. 6A and 6B indicates a boundary between the AlAs layer 26a and the Al oxidized layer 26b.

Also, in FIG. 6A, a dark circle on the outside is the mesa post 30, and a dark circle on the inside is an outline of the inside of a contact layer 24 of a circular ring. Further, a dark horizontal line in FIG. 6B is a cleavage surface.

In the sample 1 of the example of an embodiment, as shown in FIG. 6A, the Al oxidized layer 26b is formed, reflecting a surface orientation of the AlAs layer 26a, in a manner of surrounding the AlAs layer 26a in the shape of a rhomb. Also, in the sample 2 of the example of an embodiment, as shown in FIG. 6B, oxidation of the AlAs layer 26a advances uniformly, so that a tip of the Al oxidized layer 26b is formed linear.

In this way, as clear from FIG. 6A and FIG. 6B, the Al oxidized layer 26b formed according to the steam oxidation method of the examples of the present embodiment is such that its shape is properly controlled.

COMPARISON EXAMPLE

To make comparison with the samples 1 and 2 of the example of an embodiment, the samples 1 and 2 of a conventional example were experimentally made according to the steam oxidation method of the conventional example shown in FIG. 5.

Figure 2:
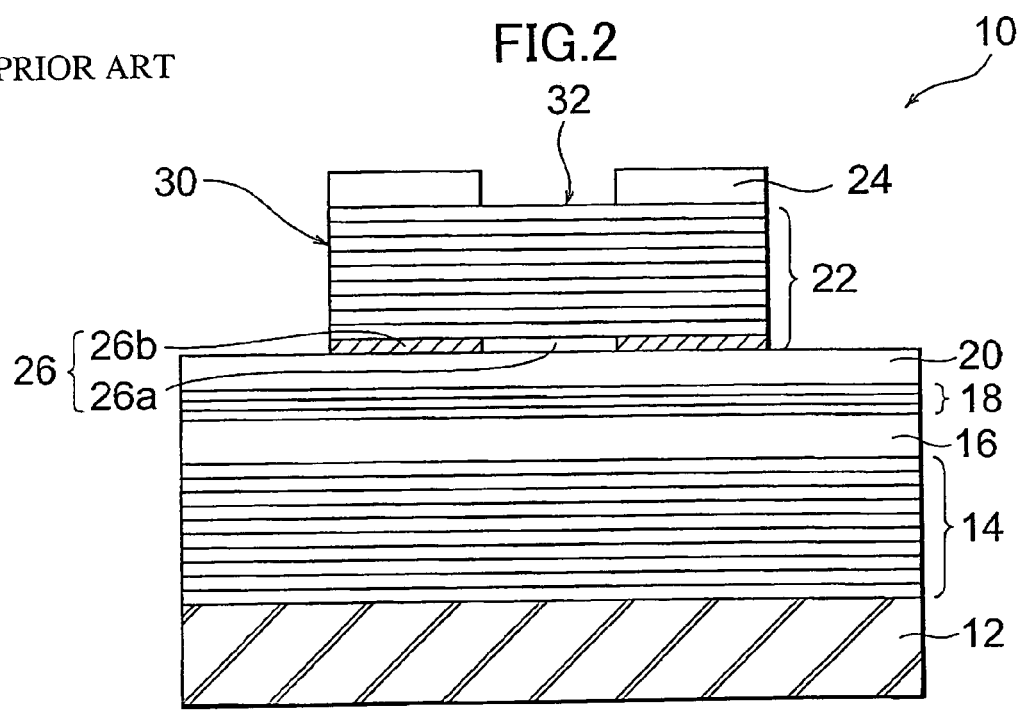
FIG. 2 is a sectional view showing a configuration of a surface emitting laser element.
Figure 7A:
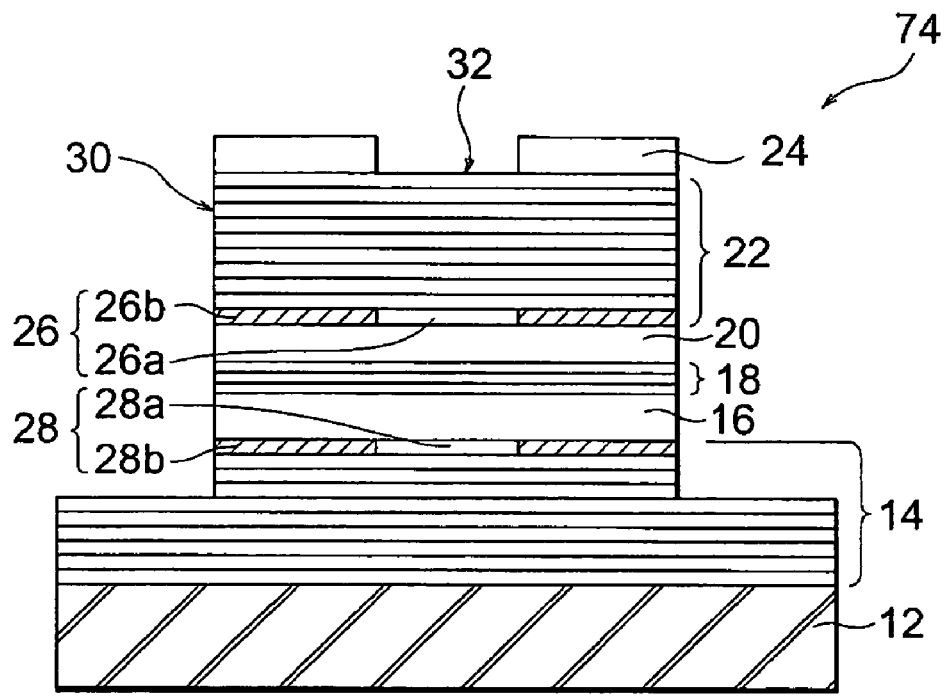
FIG. 7A is a sectional view showing a configuration of a surface emitting semiconductor laser element of the sample 1 of the conventional example.
Figure 7B:
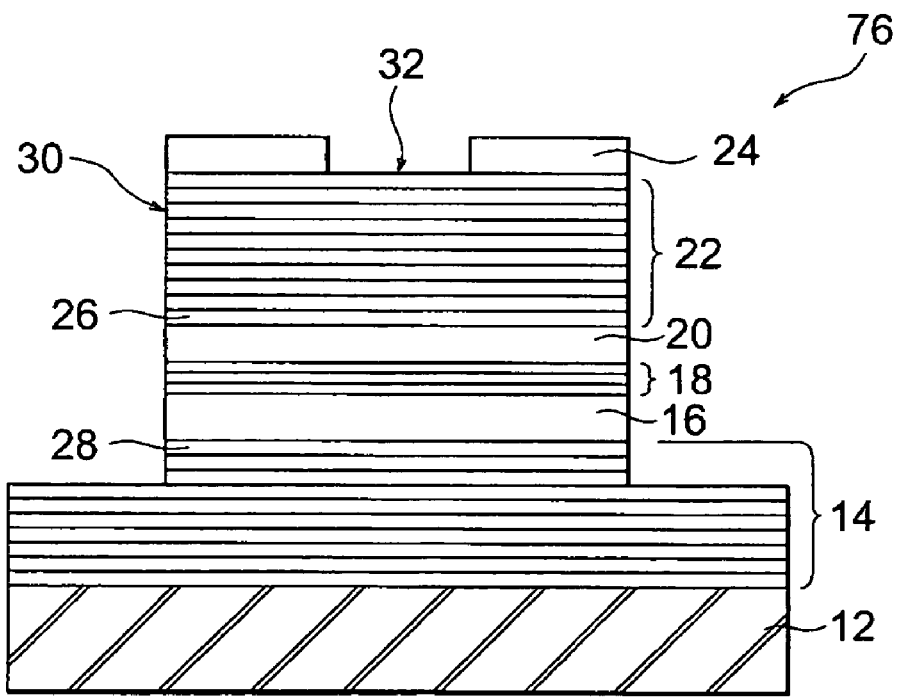
FIG. 7B is a sectional view showing a configuration of a semiconductor substrate of the sample 1 of the conventional example.

In experimentally manufacturing the sample 1 of the conventional example, in lieu of the semiconductor substrate 44 of FIG. 3, a semiconductor substrate of a comparison example shown in FIG. 7B was used to carry out steam oxidation, and in lieu of the surface emitting semiconductor laser element 10 of FIG. 2, a surface emitting semiconductor laser element of the comparison example shown in FIG. 7A was manufactured.

FIG. 7A is a sectional view showing a configuration of the surface emitting semiconductor laser element of the comparison example, and FIG. 7B is a sectional view showing a configuration of the semiconductor substrate of the comparison example. In these drawings, parts showing like configurations of the surface emitting semiconductor laser element shown in FIG. 2 and the semiconductor substrate shown in FIG. 3 are given like reference characters.

In the surface emitting semiconductor laser element of the comparison example 74, as shown in FIG. 7A, a contact layer 24, an upper DBR 22, an upper clad layer 20, an active layer 18, a lower clad layer 16, and a part of a lower DBR 14 are etched to be processed into a mesa post 20 of a columnar shape having a circular section.

Also, in the n-type $Al_{0.9}Ga_{0.1}As$ layer of the first pair in the lower DBR 14 adjacent to the lower clad layer 16, in lieu of the n-type $Al_{0.9}Ga_{0.1}As$ layer, the n-type AlAs layer 28a is formed, and excluding a circular region in the center, the AlAs layer in the vicinity thereof is selectively oxidized and converted to the Al oxidized layer 28b. Namely, this layer constitutes a second current-confining layer 28 in which the Al oxidized layer 28b functions as a current-confining region of a high electric resistance of oxidation confining type and the AlAs layer 28a functions as a current injection region.

The surface emitting semiconductor laser element 74 of the comparison example has a like configuration of the surface emitting semiconductor laser element 10 shown in FIG. 2 excluding the above. In the surface emitting semiconductor laser element 74 of the comparison example, the current-confining layer 26 formed in the upper DBR 22 is treated as a first current-confining layer 26.

The semiconductor substrate 76 may be obtained, as shown in FIG. 7B, in a process of forming a columnar mesa post 30, except for etching the portion of, the contact layer 24, the upper DBR 22, the upper clad layer 20, the active layer 18, the lower clad layer 16, and also the portion of the lower DBR 14, up to reaching part of the lower DBR 14, by the same manufacturing method as of the semiconductor substrate 44 shown in FIG. 3.

In the present comparison example, regarding a semiconductor sbustrate 76, thickness of whose first AlAs layer 26a and second AlAs layer 28a are respectively 70 nm, steam oxidation was carried out according to the steam oxidation method of the conventional example, and this was treated as the sample 1 of the conventional example.

Also, in lieu of formation of the mesa post 30, regarding another semiconductor substrate (not illustrated) which is a multi-layered structure having the same multi-layered structure as the semiconductor substrate 76 subjected to cleavage into a flat plate, its steam oxidation was carried out according to the conventional steam oxidation method, and this was treated as the sample 2 of the conventional example.

Figure 8A:
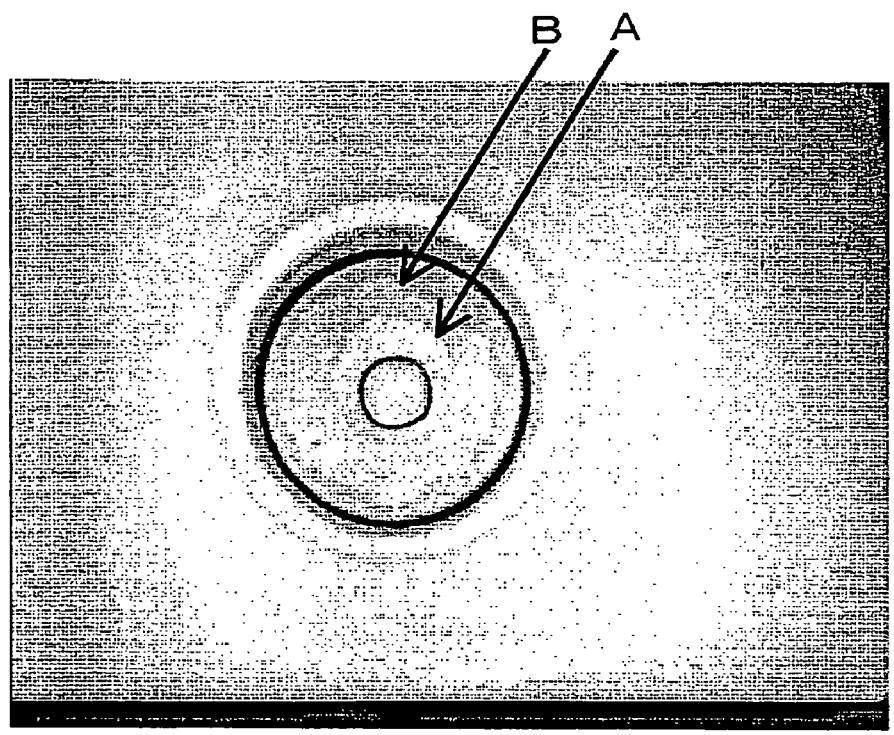
FIG. 8A and FIG. 8B are respectively infrared microscopic photographs of the semiconductor substrate and another semiconductor substrate, the AlAs layers of which were steam oxidized according to the steam oxidation method of the conventional method.
Figure 8B:

Infrared microscopic photographs of the sample 1 of the conventional example and the sample 2 of the conventional example taken from above the semiconductor substrate are respectively shown in FIG. 8A and FIG. 8B.

In FIG. 8A and FIG. 8B, an arrow A indicates a boundary between the first AlAs layer 26*a* and the first Al oxidized layer 26*b*, and arrow B is a boundary between the second AlAs layer 28*a* and the second Al oxidized layer 28*b*.

Also, in FIG. 8A, a dark circle on the outside is the mesa post 30, and a dark circle on the inside is an outline of the inside of a contact layer 24 of a circular ring. Further, a dark horizontal line in FIG. 8B is a cleavage surface.

In the sample 1 of the conventional example, as shown in FIG. 8A, the Al oxidized layers 26*b* and 28*b* both have a scattering in the oxidized length from the mesa post 30, their shapes are not isotropic, and controllability is poor. Also, in the sample 2 of the conventional example, as shown in FIG. 8B, the Al oxidized layers 26*b* and 28*b* both have an oxidized length from the cleavage surface which is not constant, and their shapes are not properly controlled. In this manner, semiconductor substrates subjected to steam oxidation according to the steam oxidation method of the conventional example have the Al oxidized layers which are not formed with good controllability.

By comparing the samples 1 and 2 of the example of the present invention to the samples 1 and 2 of the conventional example, it may be stated that the steam oxidation method of the example of an embodiment has proper controllability regarding the shape of the oxidized layers.

What is claimed is:

1. A steam oxidation method for a matter to be oxidized housed in a reactor, which comprises:
    a first step of supplying an inert gas to said reactor housing said matter to be oxidized and substituting the inside of said reactor with said inert gas;
    a second step of stopping supply of said inert gas and supplying a steam-accompanied inert gas, in which said inert gas is accompanied with steam, to said reactor;
    a third step of increasing a temperature of said matter to be oxidized to a steam oxidation temperature while supplying said steam-accompanied inert gas; and
    a fourth step of holding said matter to be oxidized for a predetermined time at the steam oxidation temperature.

2. A steam oxidation method according to claim 1, wherein said matter to be oxidized is a compound semiconductor multi-layered matter having a high Al containing layer for manufacturing a surface emitting laser element, wherein said high Al containing layer is oxidized in steam to form a current-confining structure of an oxidation confining type in said compound semiconductor multi-layered matter for manufacturing said surface emitting laser.

3. A steam oxidation method according to claim 2, wherein said high Al containing layer has preferably an Al composition of over 80%.

4. A steam oxidation method according to claim 1, wherein said temperature of said matter to be oxidized at said second step of supplying said steam-accompanied inert gas to said reactor is more than 20° C. and less than 250° C.

5. A steam oxidation method according to claim 1, wherein said steam oxidation temperature is more than 350° C. and less than 500° C.

6. A steam oxidation method according to claim 1, wherein said inert gas is $N_2$ gas.

* * * * *